(12) United States Patent
Zhu et al.

(10) Patent No.: US 12,340,870 B2
(45) Date of Patent: *Jun. 24, 2025

(54) METHOD FOR FORMING A SEMICONDUCTOR DEVICE PILLAR WITH SOURCE, CHANNEL, AND DRAIN

(71) Applicant: CHANGXIN MEMORY TECHNOLOGIES, INC., Hefei (CN)

(72) Inventors: Yiming Zhu, Hefei (CN); Erxuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 539 days.

This patent is subject to a terminal disclaimer.

(21) Appl. No.: 17/575,806

(22) Filed: Jan. 14, 2022

(65) Prior Publication Data

US 2022/0139431 A1   May 5, 2022

Related U.S. Application Data

(63) Continuation of application No. PCT/CN2021/086467, filed on Apr. 12, 2021.

(30) Foreign Application Priority Data

Apr. 27, 2020 (CN) ......................... 202010343514.2

(51) Int. Cl.
*G11C 7/18* (2006.01)
*H10B 12/00* (2023.01)
(Continued)

(52) U.S. Cl.
CPC ............. *G11C 7/18* (2013.01); *H10B 12/482* (2023.02); *H10B 51/40* (2023.02); *H10B 53/40* (2023.02); *H10B 61/20* (2023.02); *H10B 63/34* (2023.02)

(58) Field of Classification Search
CPC ........ G11C 7/18; H10B 12/482; H10B 61/20; H10B 51/40; H10B 53/40; H10B 63/34
See application file for complete search history.

(56) References Cited

U.S. PATENT DOCUMENTS 8,119,509 B2   2/2012  Cho
10,134,739 B1  11/2018 Zang et al.
(Continued)

FOREIGN PATENT DOCUMENTS

CN   101640201 A   2/2010
CN   102468181 B   3/2016
(Continued)

OTHER PUBLICATIONS

Supplementary European Search Report in the European application No. 21797863.4, mailed on Sep. 15, 2022, 9 pgs.
(Continued)

*Primary Examiner* — Joshua Benitez Rosario
*Assistant Examiner* — Scott E Bauman
(74) *Attorney, Agent, or Firm* — Kilpatrick Townsend & Stockton LLP

(57) ABSTRACT

A semiconductor structure and a method for forming the same, and a memory and a method for forming the same are provided. The method for forming the semiconductor structure includes: providing a substrate, in which a sacrificial layer and an active layer on the sacrificial layer are formed on the substrate; patterning the active layer and the sacrificial layer to form grooves which divide the active layer and the sacrificial layer into a plurality of active areas; filling the grooves to form a first isolation layer surrounding the active areas; patterning the active layer in the active areas to form a plurality of separate active patterns; removing the sacrificial layer via openings between adjacent active patterns to form gaps between bottoms of the active patterns and the
(Continued)

substrate; forming bit lines in the gaps; and forming semiconductor pillars on partial tops of the active patterns.

18 Claims, 37 Drawing Sheets

(51) Int. Cl.
*H10B 51/40* (2023.01)
*H10B 53/40* (2023.01)
*H10B 61/00* (2023.01)
*H10B 63/00* (2023.01)

(56) References Cited

U.S. PATENT DOCUMENTS

| | | | | |
|---|---|---|---|---|
| 11,895,852 | B2* | 2/2024 | Zhu | H10D 62/115 |
| 12,075,612 | B2* | 8/2024 | Zhu | H10B 12/0335 |
| 12,082,419 | B2* | 9/2024 | Zhu | H10B 12/482 |
| 12,101,927 | B2* | 9/2024 | Zhu | H10N 59/00 |
| 12,108,591 | B2* | 10/2024 | Zhu | H10B 12/315 |
| 2008/0067692 | A1* | 3/2008 | Kim | H10B 12/31 |
| | | | | 438/653 |
| 2010/0025758 | A1 | 2/2010 | Cho | |
| 2010/0078698 | A1* | 4/2010 | Son | B82Y 10/00 |
| | | | | 257/329 |
| 2012/0077337 | A1 | 3/2012 | Cho | |
| 2019/0035791 | A1 | 1/2019 | Zang et al. | |
| 2019/0157345 | A1* | 5/2019 | Zhu | H10B 61/00 |
| 2021/0074334 | A1* | 3/2021 | Zhu | G11C 5/063 |
| 2021/0335789 | A1* | 10/2021 | Zhu | H10D 30/6728 |
| 2021/0391332 | A1* | 12/2021 | Zhu | H10B 63/80 |

FOREIGN PATENT DOCUMENTS

| | | |
|---|---|---|
| CN | 108461496 A | 8/2018 |
| CN | 109285836 A | 1/2019 |
| CN | 109309092 A | 2/2019 |
| CN | 110383476 A | 10/2019 |
| CN | 211719592 U | 10/2020 |
| WO | 2020042255 A1 | 3/2020 |

OTHER PUBLICATIONS

International Search Report in the international application No. PCT/CN2021/086467, mailed on Jul. 22, 2021, 2 pgs.

* cited by examiner

METHOD FOR FORMING A SEMICONDUCTOR DEVICE PILLAR WITH SOURCE, CHANNEL, AND DRAIN

CROSS-REFERENCE TO RELATED APPLICATIONS

The present application is a continuation application of International Application No. PCT/CN2021/086467, filed on Apr. 12, 2021, which claims priority to Chinese Patent Application No. 202010343514.2, filed on Apr. 27, 2020. The disclosures of International Application No. PCT/CN2021/086467 and Chinese Patent Application No. 202010343514.2 are hereby incorporated by reference in their entireties.

BACKGROUND

A memory usually includes a data storage unit and a control transistor for controlling the data storage unit. An integration density of the transistor restricts the storage density of the memory. For a planar transistor, the size of a transistor is decreased by decreasing the channel size thereof, so that the storage density of the memory is increased.

However, with the decrease of the channel size of the transistor, degradation of performance of the transistor is caused by a narrow-width effect and a short-channel effect, which affects the performance of the memory, and restricts the transistor size and a further increase of the storage density of the memory.

SUMMARY

This disclosure relates to the technical field of semiconductors, in particular to, a semiconductor structure and a method for forming the same, and a memory and a method for forming the same.

The embodiments of present disclosure provide a method for forming a semiconductor structure. The method includes: providing a substrate, in which a sacrificial layer and an active layer on the sacrificial layer are formed on the substrate; patterning the active layer and the sacrificial layer to form grooves which divide the active layer and the sacrificial layer into a plurality of active areas; filling the grooves to form a first isolation layer surrounding the active areas; patterning the active layer in the active areas to form a plurality of separate active patterns, in which at least one of a side wall or an end portion of active pattern is connected to the first isolation layer; removing the sacrificial layer via openings between adjacent active patterns to form gaps between bottoms of the active patterns and the substrate; forming bit lines in the gaps; and forming semiconductor pillars on partial tops of the active patterns.

An embodiment of this disclosure further provides a semiconductor structure, which is formed with the above method.

An embodiment of this disclosure further provides a memory, which includes the foregoing semiconductor structure, and storage units located on the semiconductor structure and connected to the semiconductor pillars.

An embodiment of this disclosure further provides a method for forming a memory. The method includes: providing the semiconductor structure formed with the above said method; and forming storage units on the semiconductor structure, in which the storage units are connected to the semiconductor pillars.

The embodiments of present disclosure provide a method for forming a semiconductor structure.

BRIEF DESCRIPTION OF THE DRAWINGS

In order to describe the technical solutions of the embodiments in the disclosure more clearly, the accompanying drawings to be used in the embodiments of this disclosure will be simply introduced below. It is apparent that the accompanying drawings in the following descriptions are only some embodiments of this disclosure. Those of ordinary skill in the art may obtain other accompanying drawings according to these accompanying drawings without involving any creative work.

DETAILED DESCRIPTION

In order to make the objectives, technical means, and effects thereof of this disclosure clearer, this disclosure will be described further below in conjunction with the accompany drawings. It is to be understood that the embodiments described here are only part of the embodiments of this disclosure, not all of the embodiments, and not intended to limit this disclosure. All other embodiments obtained by those of ordinary skill in the art on the basis of the embodiments in this disclosure without any creative work shall fall within the scope of protection of this disclosure.

Referring to FIG. 1 to FIG. 13C, FIG. 1 to FIG. 13C are schematic structural diagrams showing a process of forming a semiconductor structure according to an embodiment of this disclosure.

Figure 1:
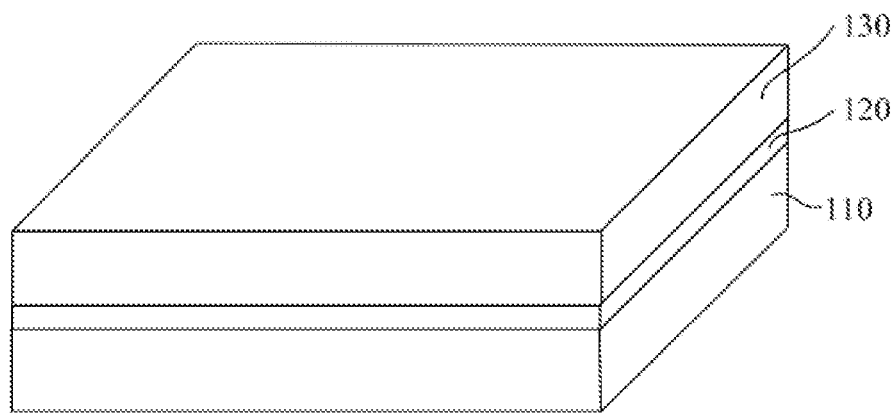
FIGS. 1, 2A-2B, 3A-3C, 4A-4B, 5A-5B, 6A-6C, 7A-7C, 8A-8C, 9A-9C, 10, 11A-11F, 12A-12C, and 13A-13C are schematic structural diagrams of showing a process of forming a semiconductor structure according to an embodiment of this disclosure.

Referring to FIG. 1, a substrate 110 is provided. A sacrificial layer 120 and an active layer 130 on a surface of the sacrificial layer are formed on a surface of the substrate 110.

The substrate 110 may be made of various semiconductor materials such as monocrystalline silicon, Ge, SiC or the like. It may be of a single-layer structure, or may be of a composite structure. In an embodiment, the substrate 110 includes a semiconductor substrate, a dielectric layer formed on a surface of the semiconductor substrate, and the like, which is not limited herein.

The sacrificial layer 120 and the active layer 130 may be sequentially formed on the surface of the substrate 110 by a deposition process. The active layer 130 uses a semiconductor material such as one or more of semiconductor materials selected from Si, Ge, SiC or SiGe, etc. The sacrificial layer 120 is made of a material different from those of the substrate 110 and the active layer 130, so that influences to the substrate 110 and the active layer 130 in a subsequent process of removing the sacrificial layer 120 may be reduced.

In the embodiment, the substrate 110 is a silicon substrate, the sacrificial layer 120 is a SiGe layer, and the active layer is a silicon layer. After the sacrificial layer 120 is formed on the substrate 110 through an epitaxial growth process, the active layer 130 is further formed on the sacrificial layer 120 through the epitaxial process.

In fact, the sacrificial layer 120 is made of a different material from those of the substrate 110 and the active layer 130, as long as the sacrificial layer 120 has a high etch selectivity to the substrate 110 and the active layer 130 in the process of removing the sacrificial layer 120.

In some embodiments, the substrate 110, the sacrificial layer 120, and the active layer 130 may be a silicon on insulator (SOI) substrate, and a buried oxide layer in the SOI substrate serves as the sacrificial layer 120.

In other embodiments, a bulk-silicon substrate may be subjected to ion implantation, so that a doped layer is formed inside the bulk-silicon substrate to serve as the sacrificial layer 120, such as Ge implantation into bulk-silicon. By controlling the implantation depth of Ge, a SiGe layer is formed inside the bulk-silicon to serve as the sacrificial layer 120, the silicon layer under the doped layer serves as the substrate 110, and the silicon layer on the doped layer serves as the active layer. In other embodiments, the doped layer may be formed by implantation of another element, such as C, O, N or the like to form the sacrificial layer 120, such that the etching rate of the doped layer is different from the respective etching rates of the material layers above and below the doped layer. Preferably, the sacrificial layer 120 may be made of a material such as silicon oxide, silicon nitride, silicon oxynitride, silicon oxycarbide, or the like.

The active layer 130 is used for forming a bottom doped region, i.e., a source/drain electrode, of a vertical transistor. The sacrificial layer 120 is used to be substituted to form a bit line in a subsequent process. According to a size of the vertical transistor to be formed and a size of the bit line, the thickness of the sacrificial layer 120 and the thickness of the active layer 130 are reasonably set. In one embodiment, the thickness of the sacrificial layer may be 35 nm to 50 nm. In the embodiment, the bottom doped region of the transistor, a channel region thereon, and a top doped region are formed separately, so that the thickness of the active layer 130 may be reduced. Thus, the probability of collapse of formed active patterns after subsequent patterning of the active layer 130 can be reduced.

Figure 2A:
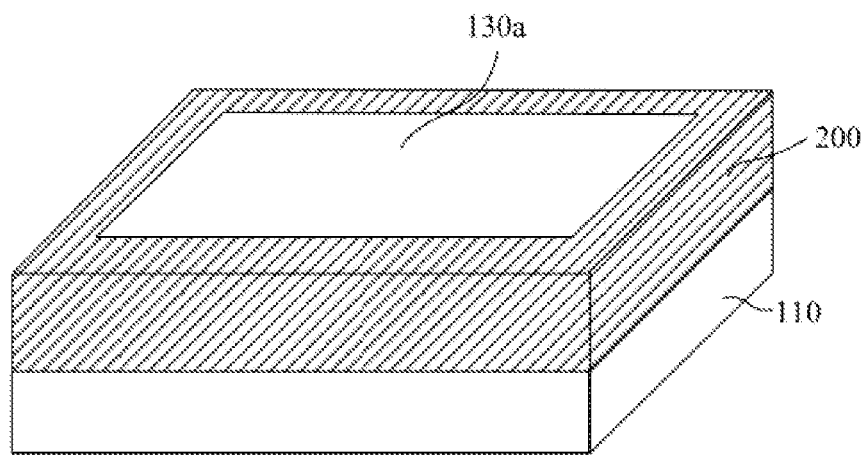
Figure 2B:
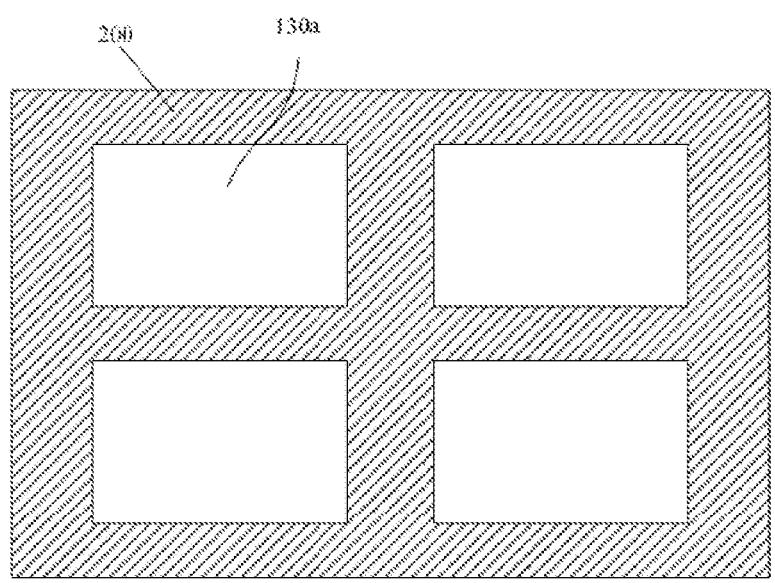

Referring to FIG. 2A and FIG. 2B, the active layer 130 and the sacrificial layer 120 are patterned to form grooves. The grooves divide the active layer 130 (refer to FIG. 1) and the sacrificial layer 120 (refer to FIG. 1) into a plurality of active areas 130a. A first isolation layer 200 surrounding the active areas 130a is formed in the grooves.

The active layer 130 and the sacrificial layer 120 are etched until reaching the surface of the substrate 110 to form the grooves which divide the active layer 130 into a plurality of active areas 130a. The grooves are filled with a dielectric material and subjected to planarization treatment to form the first isolation layer 200, so that transversely electric isolation between the active areas 130a is achieved.

FIG. 2A is a schematic structural diagram of one active area 130a surrounded by the first isolation layer 200. FIG. 2B is a top view of a plurality of active areas 130a and the first isolation layer 200.

The size of the active area 130a may be designed according to requirements. In some embodiments, if a control transistor of a memory is formed in the active area 130a, the active area 130a may correspond to a storage block.

Figure 3A:
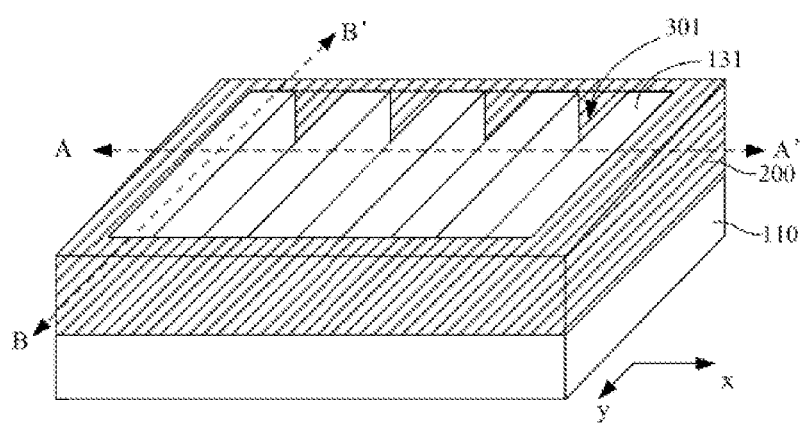
Figure 3B:
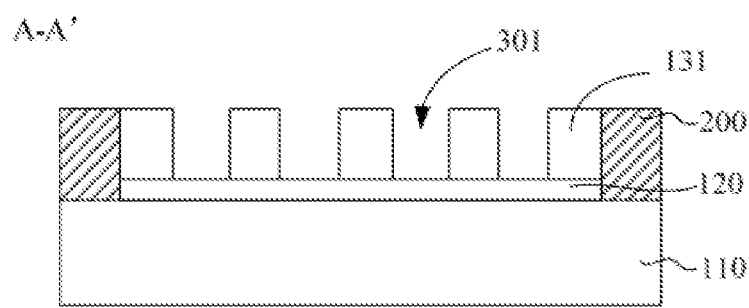
Figure 3C:
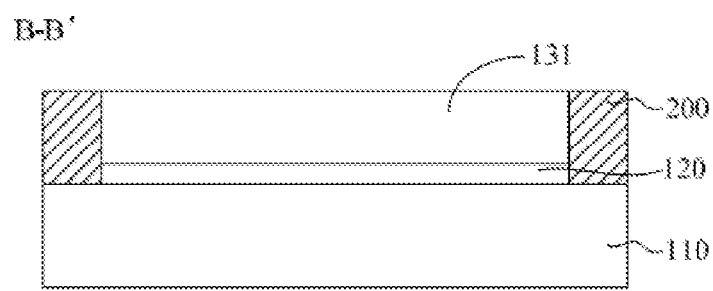

Referring to FIG. 3A to FIG. 3C, the active layer in the active area 130a is patterned to form a plurality of separate active patterns. At least one side wall or one end portion of active pattern is connected to the first isolation layer 200. FIG. 3B is a cross-sectional diagram along the line A-A' in FIG. 3A, and FIG. 3C is a cross-sectional diagram along the line B-B' in FIG. 3A.

In the embodiment, the active layer in the active area 130a is patterned to form a plurality of elongated active lines 131 which are arranged in parallel and extend along a first direction (y-direction). An opening 301 is formed between two adjacent active lines 131. End portions of all the active lines 131 are connected to the first isolation layer 200; and one side wall of an active line 131 at the edge of the active area 130a is also connected to the first isolation layer 200.

In the embodiment, only the active layer is patterned. In other embodiments, alternatively, the sacrificial layer 120 may be further etched, so that the sacrificial layer 120, at the bottom of the opening 301 is removed.

In the embodiment, a method for forming the active lines 131 includes: forming a patterned mask layer (not shown) on a surface of the active area 130a, in which opening patterns extending along the first direction are provided; etching the active layer 130 into the elongated active lines 131 and the openings 301 with the patterned mask layer as a mask.

In other embodiments, alternatively, the active layer in the active area may be patterned to form active pillars, for embodiment, to form a plurality of active pillars arranged in two lines or two rows, and at least one side wall of active pillar is connected to the first isolation layer 200. In other embodiments, the active pillars in more lines or rows may also be formed; by deposition of a dielectric layer between the active pillars, such that at least one side wall of active pillar is ensured to be connected to the dielectric layer, and the active pillars can keep suspending after the sacrificial layer 120 at the bottom of the active pillar is removed in the subsequent process.

Figure 4A:
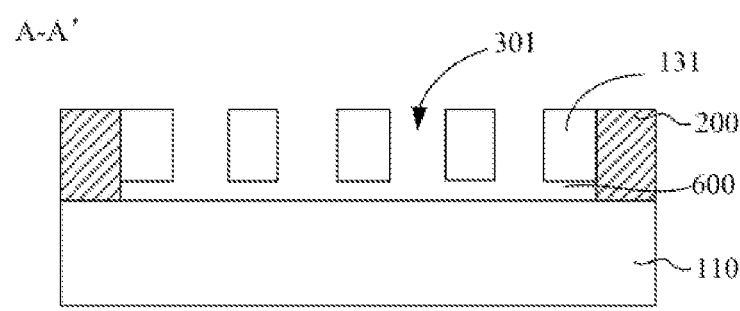
Figure 4B:
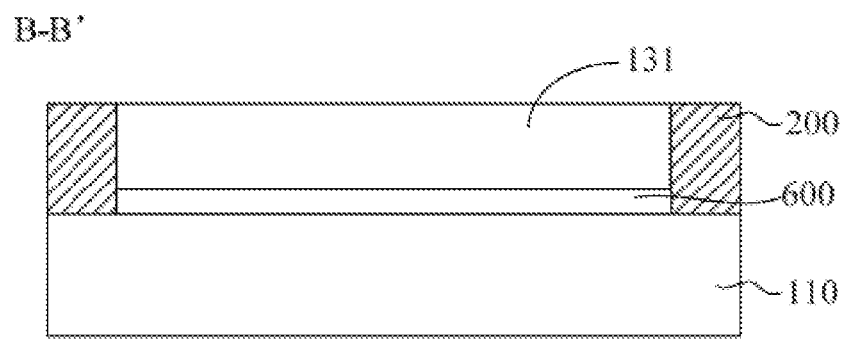

Referring to FIG. 4A and FIG. 4B, the sacrificial layer 120a is removed along the opening 301, and a gap 600 is formed between a bottom of active line 131 and the substrate 110.

The sacrificial layer 120 is removed by a wet etching process. Those skilled in the art may select a suitable etching solution depending on the material of the sacrificial layer 120, to allow the sacrificial layer 120 having a high etch selection ratio to the active line 131 and the first isolation layer 200 in the wet etching process, so that influences to the active line 131 and the first isolation layer 200 are reduced when removing the sacrificial layer 120.

After the sacrificial layer 120 is removed, active line 131 is supported by the first isolation layer 200, and is suspended above the substrate 110, thus the gaps 600 are formed between active line 131 and the substrate 110.

Figure 5A:
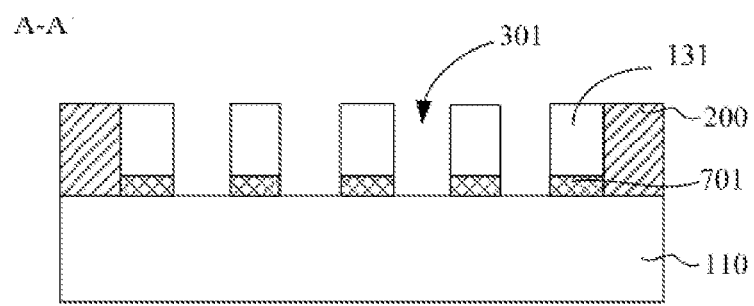
Figure 5B:
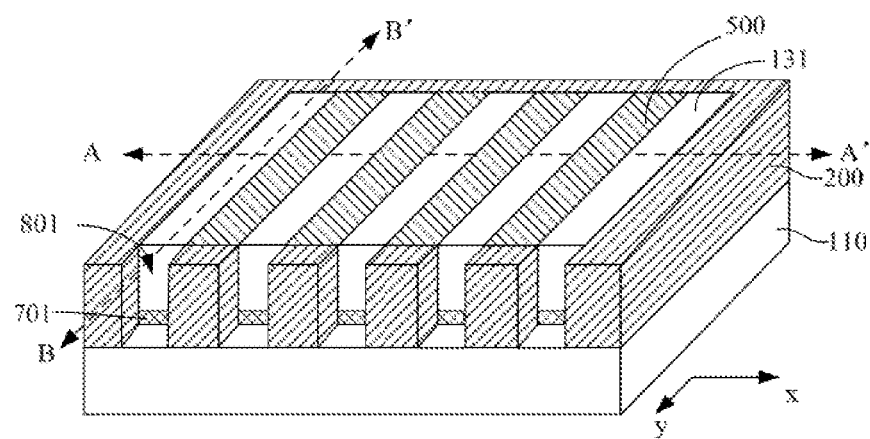

Referring to FIG. 5A to FIG. 5B, gap 600 is filled with a conductive material to form a bit line 701 extending along the first direction.

The conductive material such as polycrystalline silicon or a metal material, e.g., Cu, Ag, or Al, may be deposited in the gap 600 by a process such as chemical vapor deposition, or physical vapor deposition.

The conductive material fills the gaps 600 to form the bit lines 701 located below the bottom of the active lines 131. The conductive material further fills up the openings 301 and covers the tops of the first isolation layer 200 and the active lines 131. In the subsequent process, the conductive material on the tops of the first isolation layer 200 and the active lines 131 may be removed by etching back or planarization treatment, and the conductive material in the openings 301 may be removed through etching process, so that interconnection between the bit lines 701 below the bottoms of adjacent active lines 131 is avoided.

Figure 6A:
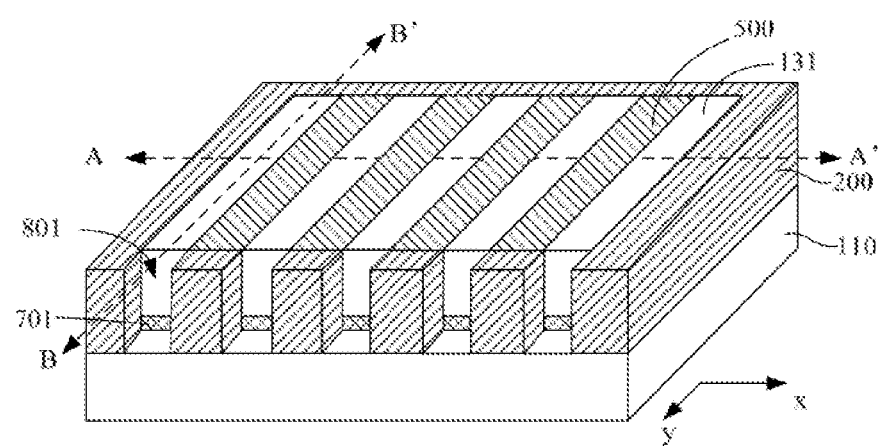
Figure 6B:
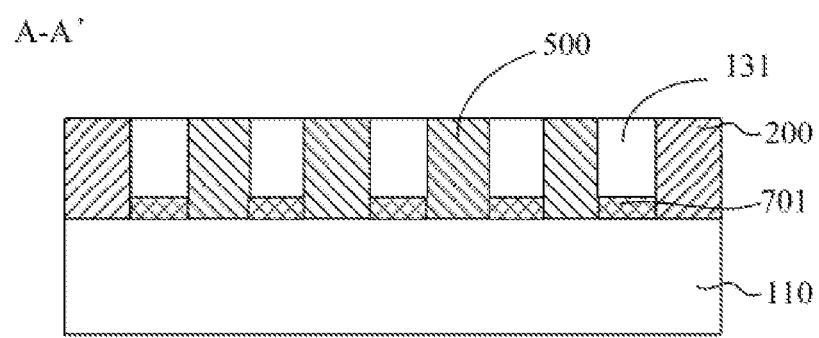
Figure 6C:
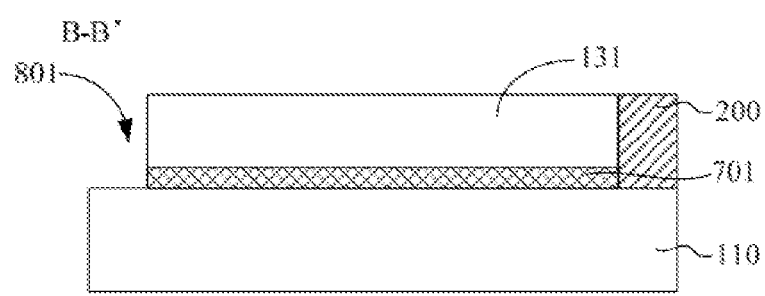

Referring to FIG. 6A to FIG. 6C, an isolation dielectric layer 500 that fills spacing between the active lines 131 is formed on the surface of the substrate 110 and subjected to planarization. A through hole 801 exposing the surface of the substrate 110 is formed at an end portion of active line 131. FIG. 6B is a cross-sectional diagram along the cutting line A-A' in FIG. 6A, and FIG. 6C is a cross-sectional diagram along the cutting line B-B' in FIG. 6A.

The isolation dielectric layer 500 is made of a dielectric material, and used for providing electric isolation between the active lines 131. In the embodiment, the isolation dielectric layer 500 is made of a material of silicon oxide. In the embodiment, the isolation dielectric layer 500 is formed by a chemical vapor deposition method. After an isolation material layer that fills the spacing between the adjacent active lines 131 and covers the tops of the active lines 131 is formed on the surface of the substrate 110, the isolation material layer is subjected to planarization to form the isolation dielectric layer 500. In the embodiment, the top of the isolation dielectric layer 500 is flush with the top of the active lines 131. In other embodiments, a patterned mask layer used for patterning of the active layer is remained on the top of the active lines 131, and the isolation dielectric layer 500 is flush with the patterned mask layer. In other embodiments, the patterned mask layer has been removed before forming of the isolation dielectric layer 500, and the isolation dielectric layer 500 still covers the tops of the active lines 131, which may protect the tops of the active lines 131 in the subsequent process.

The isolation dielectric layer 500 may provide a planarized surface, for forming a mask layer that is used for etching of the active lines 131 to form the through holes. In other embodiments, forming of the isolation dielectric layer 500 may be omitted. In a process of etching the active lines 131, the openings 301 are filled with a material of the mask layer, for embodiment, a bottom antireflection layer, so as to form a flat surface.

In the embodiment, the through holes 801 are formed by etching the portion of the first isolation layer 200 at one end portion of active line 131, and bit line 701 is exposed to a side wall at the bottom of through hole 801. In other embodiments, alternatively, a through hole 801 may be formed at other position of active line 131.

Figure 7A:
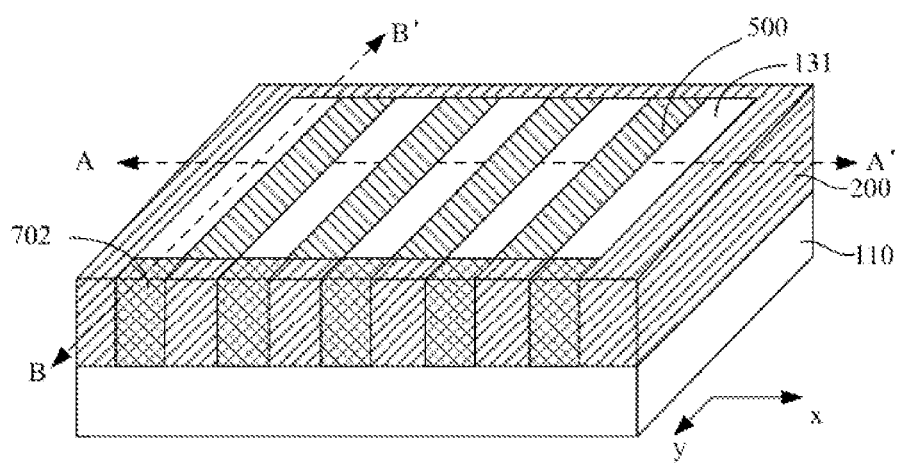
Figure 7B:
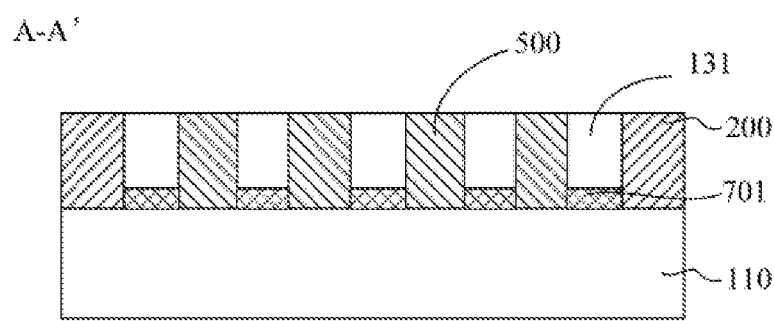
Figure 7C:
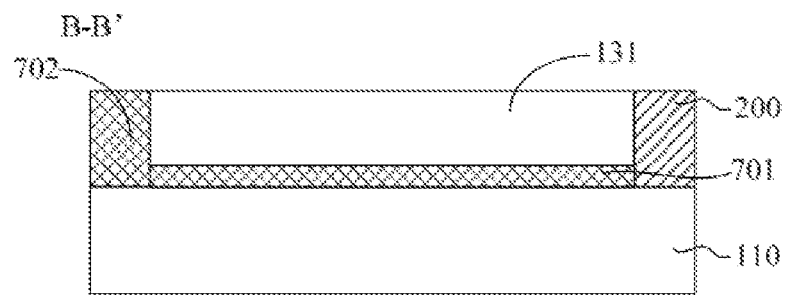

Referring to FIG. 7A to FIG. 7C, through hole 801 is filled with a conductive material and is subjected to planarization, so that a bit line connecting line 702 is formed.

The bottom of the bit line connecting line 702 is connected to the bit line 701 for leading out of the bit line 701 buried under the active line 131, thereby facilitating application of a control signal to the bit line 701. The bit line 701 is located under the active line 131, is in electric connection with the first doped region 1311 at the bottom of the active line 131, and extends along the extension direction of the active line 131.

In other embodiments, alternatively, the bit line connecting line may be formed after the second isolation layer 1200 (FIG. 13A) is formed.

Figure 8A:
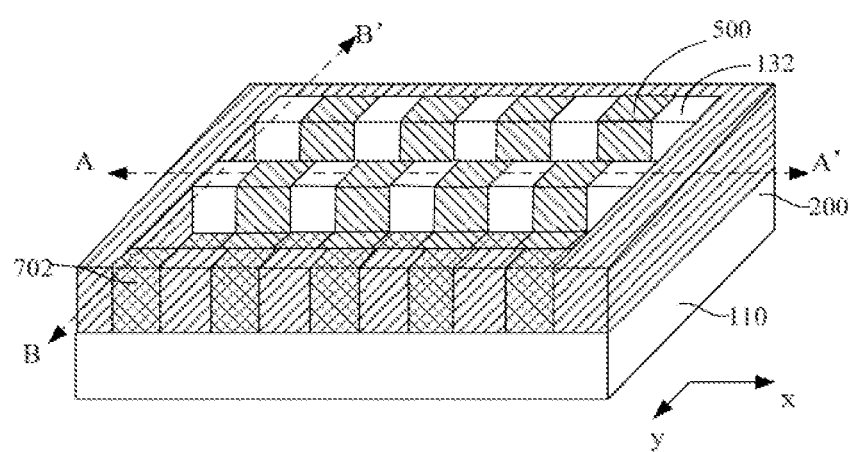
Figure 8B:
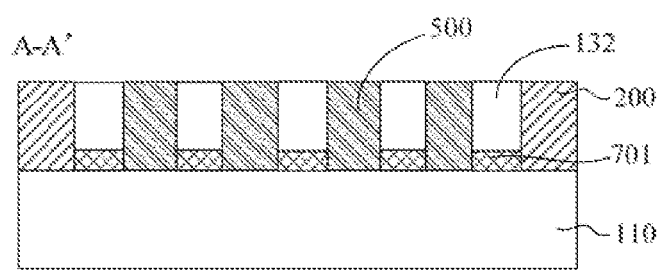
Figure 8C:
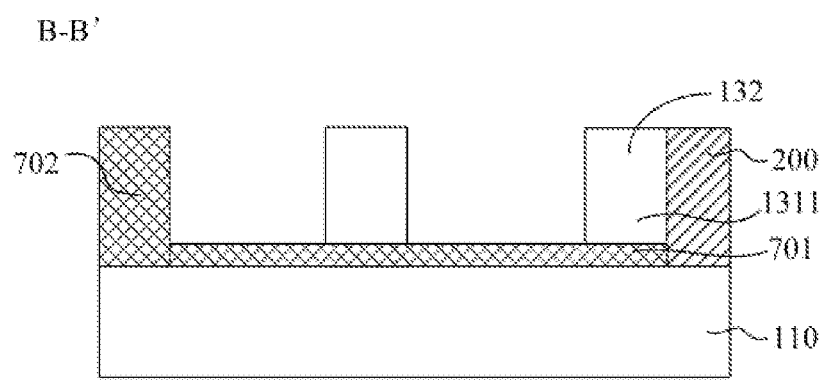

Referring to FIG. 8A to FIG. 8C, active line 131 is patterned to form a plurality of separate active pillars 132.

Active line 131 is patterned to form the active pillars 132. The active pillars 132 are arranged in an array along a first direction (y-direction) and a second direction (x-direction). In the embodiment, during patterning of the active line 131, the isolation dielectric layer 500 is etched. In the embodiment, the first direction is perpendicular to the second direction. In other embodiments, the first direction and the second direction may form an angle in a range of 60° to 120°.

In other embodiments, with a selective etching process, only the active lines 131 may be patterned.

Figure 9A:
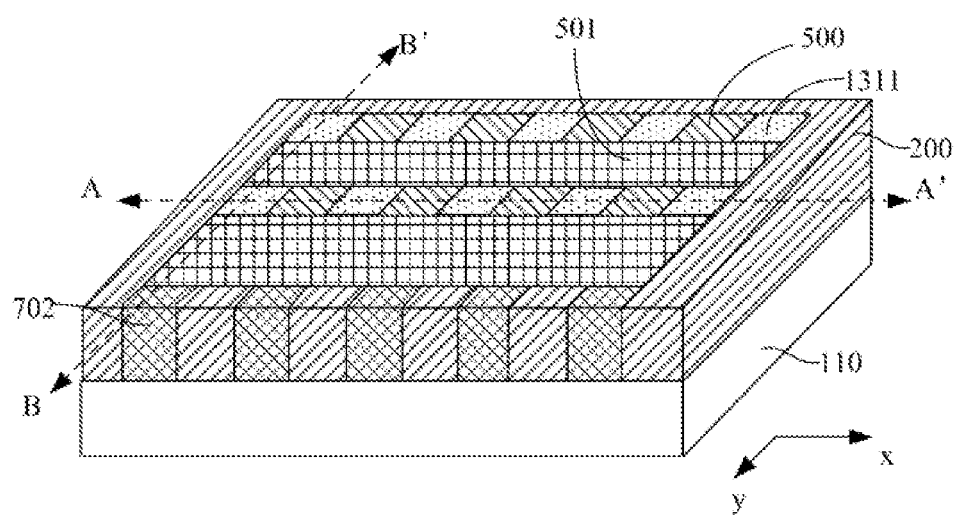
Figure 9B:
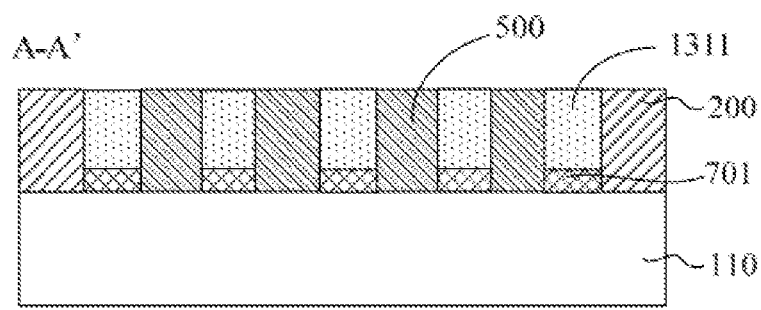
Figure 9C:
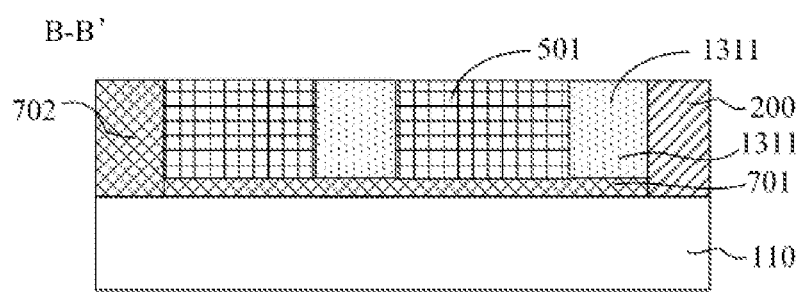

Referring to FIG. 9A to FIG. 9C, an isolation dielectric layer 501 is filled in the opening between adjacent active pillars 132; active pillar 132 is subjected to ion implantation, so that a first doped region 1311 is formed.

In other embodiments, alternatively, the first doped region 1311 may be formed by a diffusion treatment. Specifically, a transitional layer having a doping element is formed on the surface of the substrate 110 between two adjacent active lines 131 (referring to FIG. 3A); and by the diffusion treatment, at least part of the doping element in the transitional layer having the doped atoms are diffused into active line 131 to form a doped active line which is patterned to form the first doped region 1311. In other embodiments, alternatively, a transitional layer with the doping element may be formed on the surface of the substrate between the active pillars 132 (refer to FIG. 8A); further, by the diffusion treatment, the doping element is diffused into active pillar 132, so that the first doped region 1311 is formed.

A transitional layer with a certain thickness may be formed by etching back after deposition of a transitional layer material on the substrate 110. The thickness of the transitional layer may be adjusted according to dimensional requirements of a source/drain region of a transistor to be formed. In some embodiments, the thickness of the transitional layer is consistent with a height of active line 131 or active pillar 132. In some embodiments, the transitional layer may cover the tops of the active lines 131 or the tops of the active pillars 132, thereby ensuring doping of the entire active lines 131 or the entire active pillars 132.

The material of the transitional layer and that of the active layer are different, which may be materials that facilitate diffusion of impurities, for embodiment, polycrystalline silicon, and may also be other materials, for embodiment, dielectric materials such as silicon oxide, silicon nitride, or silicon oxynitride. A method for forming the transitional layer with a doping element includes: after a transitional layer with a certain thickness, without being doped, is formed on the surface of the substrate 110, ion implantation is performed to dope the transitional layer. Here, the top of the active line 131 or the active pillar 132 is covered with the patterned mask layer. By controlling energy of the ion implantation, only the transitional layer is doped through the ion implantation. Based on types of the transistors to be formed, N-type ions or P-type ions or atomic clusters with N-type ions or P-type ions may be implanted to the transitional layer. The doping element in the transitional layer may exist in a form of ions, atoms, compound molecules, or clusters. In other embodiments, in the process of forming the transitional layer, doping gases with the doping element may be added in deposition process, so that the transitional layer with the doping element is directly formed by the in-situ doping process.

The diffusion treatment may be a thermal annealing process. Based on a diffusion efficiency of the doping atoms, an annealing process with appropriate parameters may be selected, such that the doping element in the transitional layer is diffused into the active line 131 or the active pillar 132 so as to form the first doped region 1311. An internal doping concentration of the first doped region formed by the diffusion treatment may be adjusted by adjusting concentrations of the doping element in the transitional layer, duration of diffusion treatment, temperature, or the like.

In other embodiments, the in-situ doping process may also be adopted to dope the active layer 130 during forming of the active layer 130 by the epitaxial deposition process; and after the active layer 130 is patterned, the first doped region 1311 is formed.

Compared with the process of ion implantation for forming the first doped region 1311, surface damage of the active pillars 132 (the first doped region 1311) can be reduced by using the diffusion process or the in-situ doping process.

Figure 10:
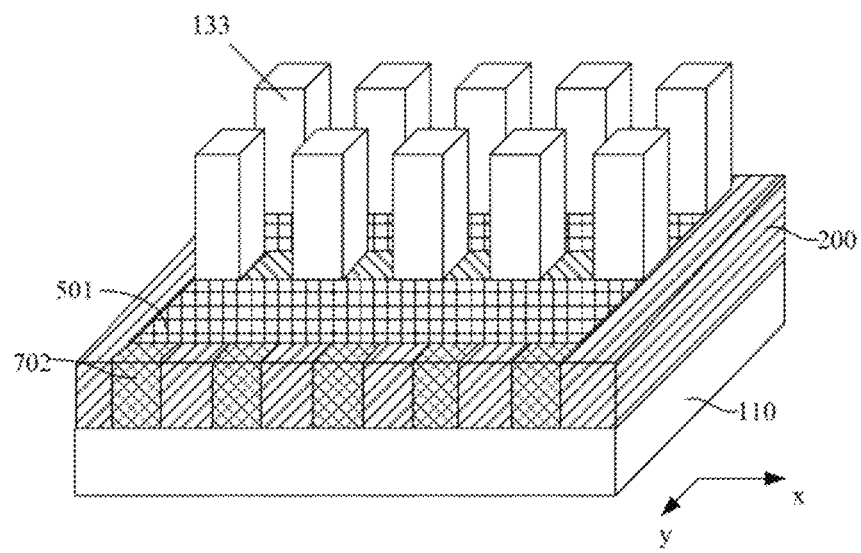

Referring to FIG. 10, a semiconductor pillar 133 is formed on a surface of the first doped region 1311.

In the embodiment, by a selective epitaxial process, a semiconductor material epitaxially grows on the top surface of active pillar, so that the semiconductor pillar 133 located on the top of active pillar is formed. Due to the selective epitaxial process, epitaxial growth of the semiconductor material can only be achieved on the top surface of the active pillar, i.e., the first doped region 1311. The material of the semiconductor pillar 133 and the material of the active pillar are same, i.e., Si. In other embodiments, the semiconductor pillar 133 may also be made of other semiconductor material such as SiGe or the like. After the semiconductor material is grown epitaxially to a certain thickness, the grown semiconductor material may be further etched and shaped to form the semiconductor pillar 133 with a flatter surface.

In other embodiments, alternatively, a chemical vapor disposition (CVD) process may be adopted to deposit the semiconductor material on a surface of the structure shown in FIG. 9 covering surfaces of the first isolation layer 200, the isolation dielectric layers 500, 501 and the first doped region 1311, the semiconductor material is then patterned to form the semiconductor pillars located on the top of the first doped regions 1311.

Figure 10A:
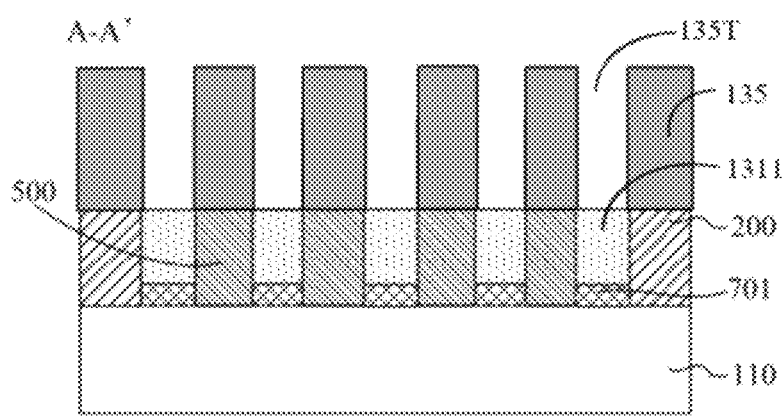
Figure 10B:
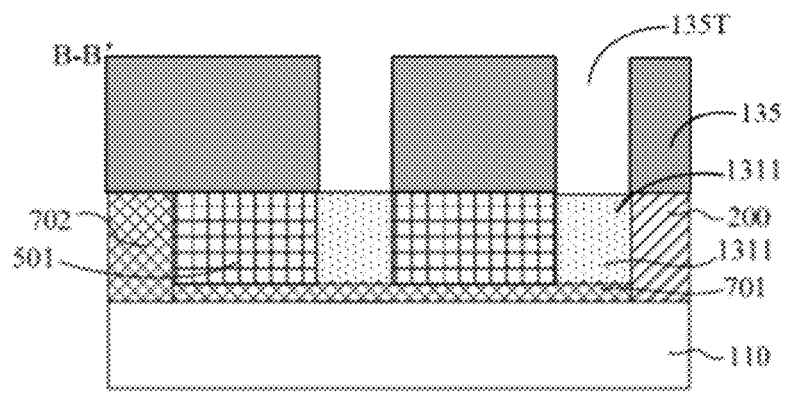

In other embodiments, a method for forming the semiconductor pillar includes: referring to FIGS. 10A and 10B, forming a protective layer 135 on surfaces of the first isolation layer 200 and the isolation dielectric layers 500, 501; forming epitaxial through holes 135T in the protective layer 135; exposing the top surface of the active pillars from the epitaxial through holes 135T; performing epitaxial growth of the semiconductor material on the top surface of active pillar to form the semiconductor pillars 133 located in the epitaxial through holes 135T; and referring to FIG. 10, removing the protective layer 135. The epitaxial through holes may limit the size and position of the semiconductor pillars to be grown, the etching for morphological shaping can be omitted. The problem such as collapse of the semiconductor pillars during growing or shaping can be avoided.

Figure 11A:
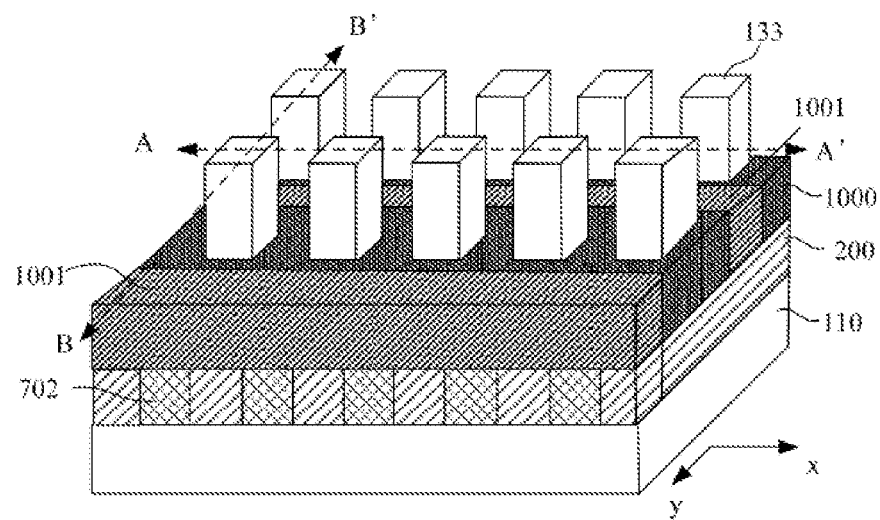
Figure 11B:
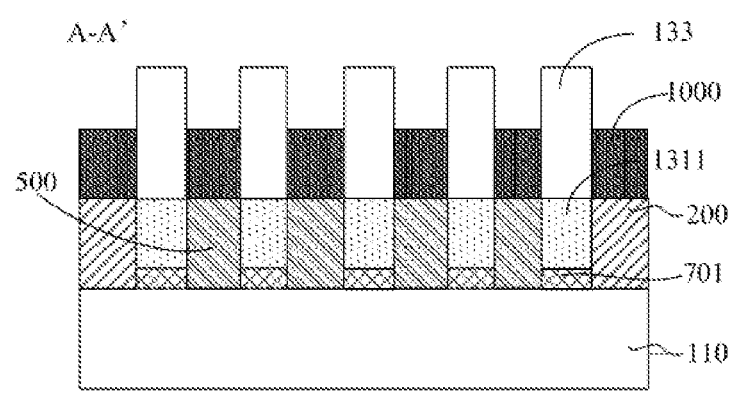
Figure 11C:
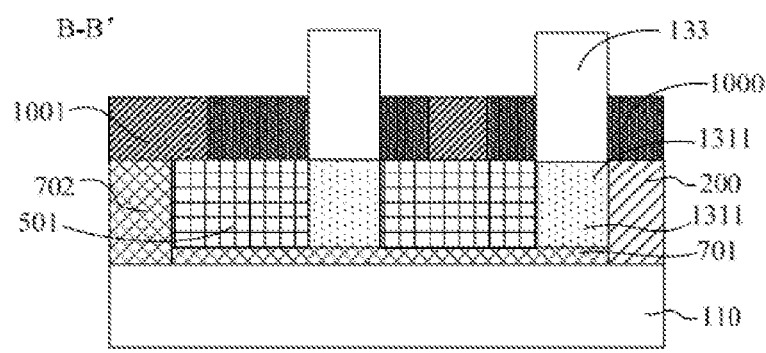

Referring to FIG. 11A to FIG. 11C, in semiconductor pillar 133, a channel region located on the surface of first doped region 1311 is formed, and a gate structure 1000 that surrounds the channel region is formed.

In the embodiment of this disclosure, the semiconductor pillars 133 may be subjected to channel ion implantation by means of ion implantation, so that a channel region is formed on first doped region 1311. Through the channel ion implantation, parameters such as a threshold voltage of a transistor to be formed may be adjusted.

In other embodiments, in the process of forming the semiconductor pillars 133, channel doping may be performed at the corresponding position of the channel region by the in-situ doping process.

A gate dielectric layer and a gate layer are sequentially formed on the surfaces of semiconductor pillars 133, the first isolation layer 200, and the isolation dielectric layer 500, 501; and the gate dielectric layer and the gate layer are patterned, to form the gate structure 1000 surrounding the channel region of semiconductor pillar 133, and the top area of semiconductor pillar 133 is exposed. The gate structure 1000 includes the gate layer and the gate dielectric layer. FIG. 11A to FIG. 11B only show the gate layer, and the gate dielectric layer is omitted.

The gate dielectric layer may be formed with a gate dielectric material such as silicon oxide, hafnium oxide, aluminum oxide or the like. The gate layer may be formed with a conductive material such as polysilicon, tungsten, copper, aluminum or the like.

Figure 11D:
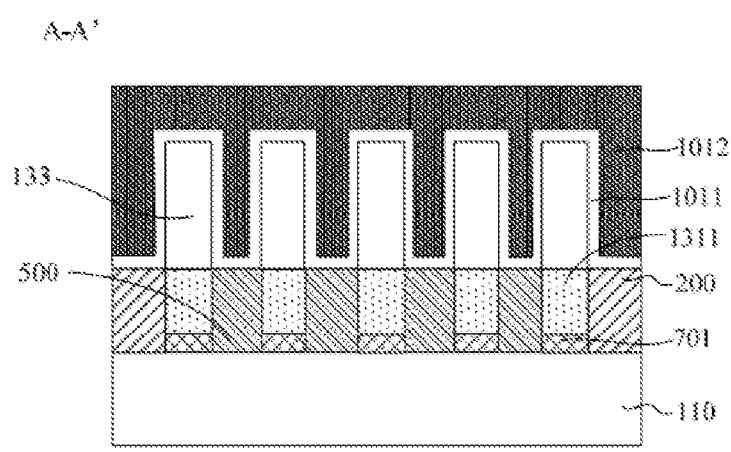
Figure 11E:
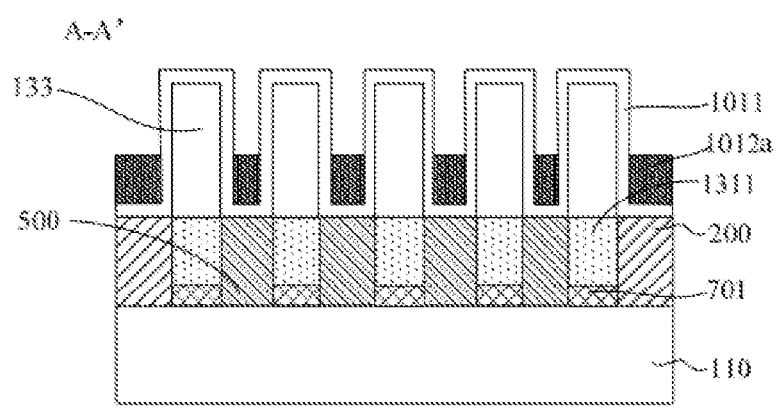
Figure 11F:
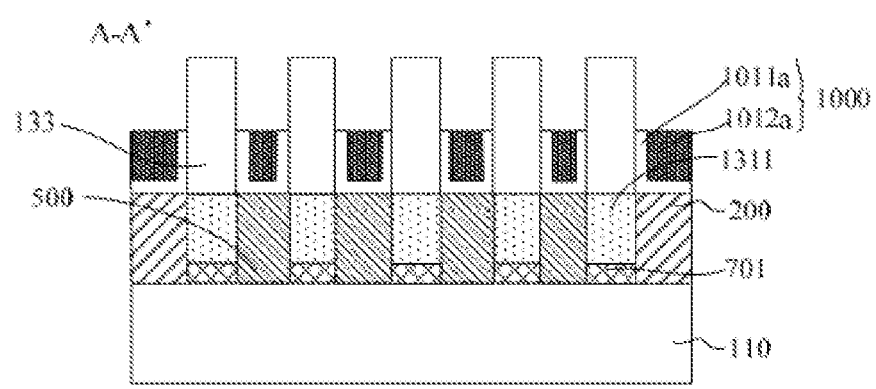

FIG. 11D to FIG. 11F are schematic structural diagrams showing the processes for forming of a gate structure 1000 according to an embodiment of this disclosure. Referring to FIG. 11D, a gate dielectric layer 1011 and a gate layer 1012, covering the surface of the structure in FIG. 10, are sequentially formed with a deposition process. The gate layer integrally covers the structure below, and the top of the gate layer is higher than the top of semiconductor pillar 133. Referring to FIG. 11E, with the planarization and etching back processes, the gate layer 1012 is etched, so that the height of the etched-back gate layer 1012a is lower than the top of semiconductor pillar 133. Referring to FIG. 11F, the exposed gate dielectric layer covering the upper portion of semiconductor pillar 133 is removed. The exposed gate dielectric layer is removed by a chemical dry etching process, and only the gate dielectric layer 1011a covered with the gate layer 1012a is remained. The chemical dry etching process can fully remove the exposed gate dielectric layer due to its good isotropic etching advantage. The gate layer 1012a and the gate dielectric layer 1011a constitute the gate structure 1000 that surrounds the channel region of semiconductor pillar 133.

In this embodiment, a word line is composed of interconnection of the gate electrodes of the gate structures 1000 on the surfaces of the semiconductor pillars 133 that are arranged on a same line along the second direction (x-direction).

In other embodiments, alternatively, the gate structures 1000 on the surfaces of the semiconductor pillars 133 may be independent to each other.

In order to achieve electric isolation between the gate structures 1000, an isolation dielectric layer 1001 is filled between the adjacent gate structures 1000 after the gate structure 1000 is formed. In other embodiments, alternatively, the isolation dielectric layer 1001 may be formed first and then subjected to patterning to form openings, and the gate structures 1000 are formed in the openings.

Figure 12A:
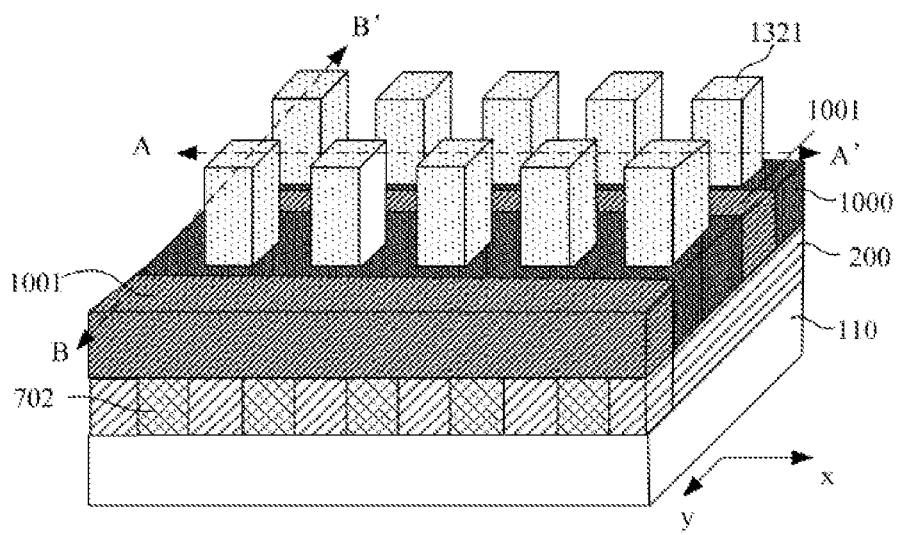
Figure 12B:
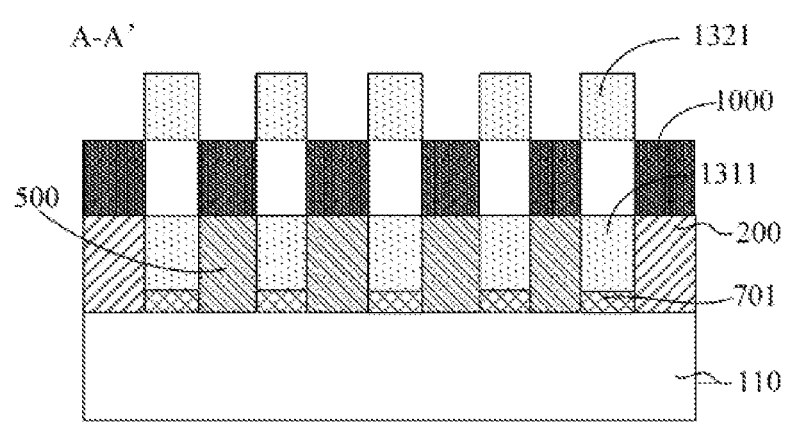
Figure 12C:
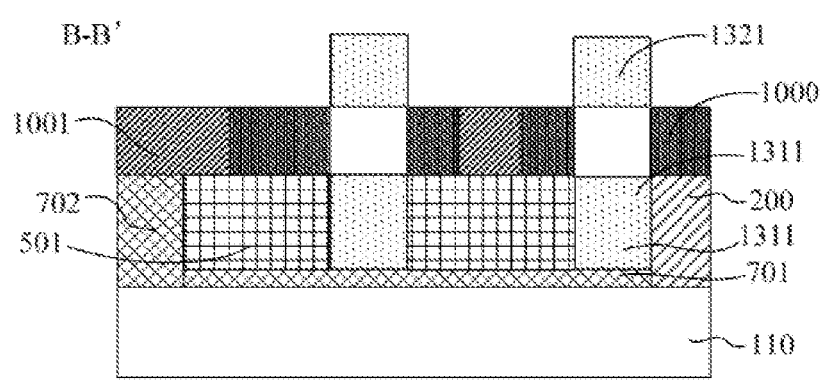

Referring to FIG. 12A to FIG. 12C, after the gate structures 1000 are formed, the top area of active pillar 132 is subjected to ion implantation to form the second doped region 1321.

The second doped region 1321 and the first doped region 1311 are of the same doping type, and respectively serve as a source electrode or a drain electrode of a vertical transistor. In other embodiments, alternatively, the second doped region 1321 may be formed by a suitable means such as in-situ doping, diffusion, or implantation in the above process, which will not be elaborated here.

Figure 13A:
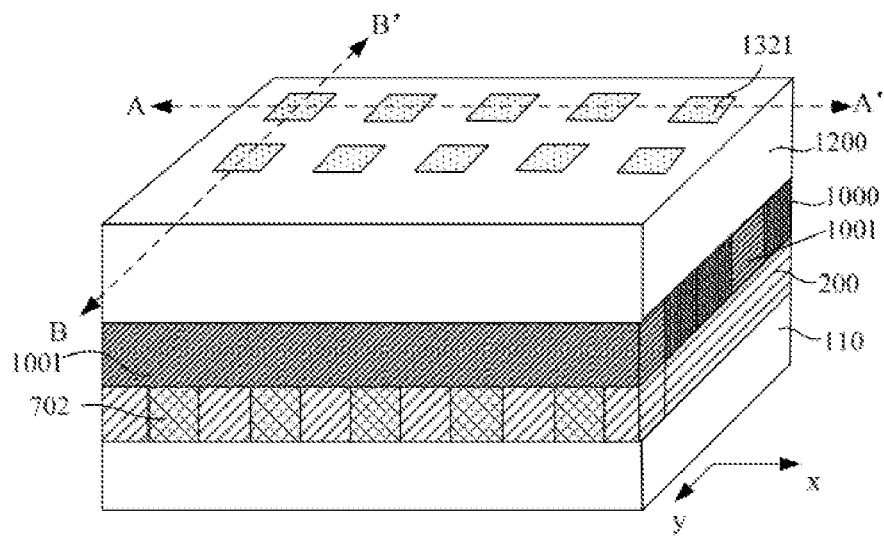
Figure 13B:
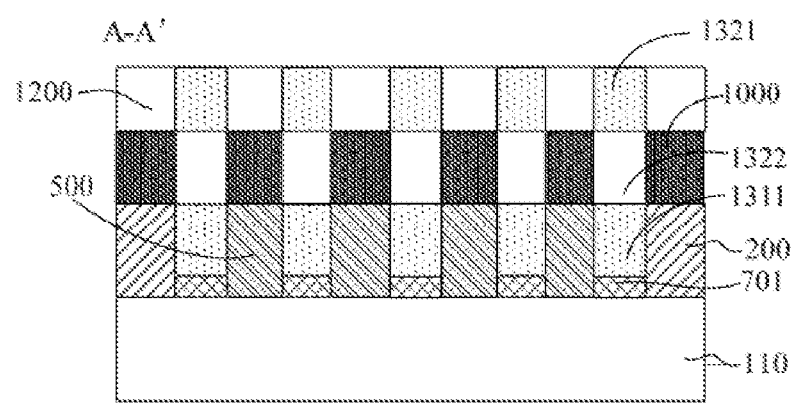
Figure 13C:
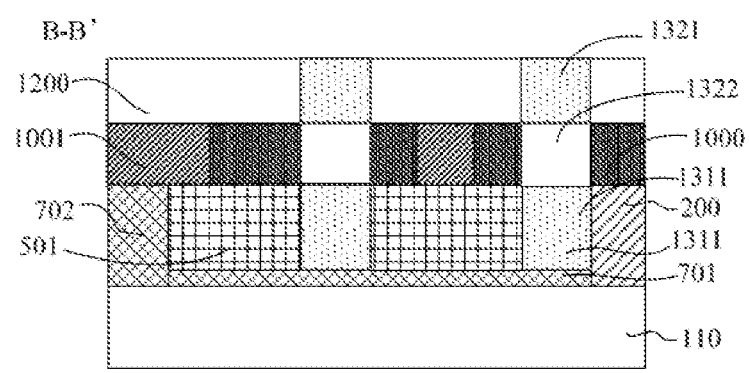

Referring to FIG. 13A to FIG. 13C, a second isolation layer 1200 covering the gate structures 1000 and the second doped regions 1321 is formed. The second isolation layer 1200 exposes the top surface of the second doped region 1321.

The second isolation layer 1200 may be made of an insulating dielectric material such as silicon oxide, silicon oxynitride or the like, which forms isolation layers, together with the first isolation layer 200, the isolation dielectric layer 500, 501, and the isolation dielectric layer 1001, between the vertical transistors, and provides a flat surface for forming additional semiconductor structures or material layers on the vertical transistors.

In other embodiments, an interconnected structure running through the second isolation layer 1200 and the bit line connecting line 702 may also be formed. In other embodiments, alternatively, the bit line connecting line that runs through the second isolation layer 1200 and the first isolation layer 200, and is connected to the bit line 701 may be formed.

With the above method, the vertical transistors are formed on the substrate, the buried bit lines are formed between the bottom of e first doped region of vertical transistor and the substrate, so that the area of transistor may be reduced, and the problem about how to apply a bit line signal is solved.

Embodiments of this disclosure further provide a semiconductor structure.

Referring to FIG. 13A to FIG. 13C, FIG. 13A to FIG. 13C are schematic structural diagrams of a semiconductor structure according to an embodiment of this disclosure.

The semiconductor structure includes a substrate 110, a vertical transistor located on the substrate 110, and a bit line 701 connected to a bottom of the vertical transistor and located between the bottom of the vertical transistor and the substrate 110. In the specific embodiment, the semiconductor structure is shown in FIG. 13A to FIG. 13C.

In other embodiments of this disclosure, the semiconductor structure may be formed by the method in the foregoing embodiments, or by other methods. All the semiconductor structures which have a vertical transistor and a buried bit line located below the bottom of the vertical transistor is the semiconductor structures claimed in this disclosure.

In the embodiment, the vertical transistor includes sequentially upwards arranged a first doped region 1311, a channel region 1322 and a second doped region 1321 on the surface of the substrate 110, and a gate structure 1000 surrounding the channel region 1322.

A plurality of the vertical transistors are formed on the semiconductor structure and arranged as array along a first direction (y-direction) and a second direction (x-direction). The first doped regions 1311 at the bottom of the vertical transistors arranged on a same line along the first direction are connected to one bit line 701. The gate structures 1000 of the vertical transistors on a same line along the second direction are interconnected.

The semiconductor further includes: isolation layers, formed between the vertical transistors, located on the substrate 110. The isolation layers include an isolation dielectric layer 500, 501 located between the bit lines 701 and between the first doped regions 1311, an isolation dielectric layer 1001 between adjacent gate structures 1000, a second isolation layer 1200 between adjacent second doped regions 1321 on the surface of the isolation dielectric layer 1001, and a first isolation layer 200a surrounding the periphery of the vertical transistors.

The semiconductor structure further includes: a through hole located in the isolation layer. A bit line connecting line 702 is formed in the through hole. A bottom of the bit line connecting line 702 is connected to the bit line 701. In the embodiment, the bit line connecting line 702 is located at one edge of the transistor array. Bit line connecting line 702 is formed on one side of the line of transistors arranged along the y-direction, which is connected to the bit line 701 arranged under the line of transistors. A first isolation layer 200 is arranged between adjacent bit line connecting lines 702.

In the embodiment, the channel region 1322 and the second doped region 1321 of the vertical transistor are formed in the semiconductor pillar on the surface of the first doped region 1311. A semiconductor layers where the channel region 1322 and the second doped region 1321 are located and the semiconductor pillar are not an integral structure. They are separately formed. In some embodiments, the first doped region 1311, the channel region 1322, the second doped region 1321 of the vertical transistor are located in the same active pillar. The active pillar is of an integral structure. The first doped region 1311, the channel region 1322, and the second doped region 1321 are formed by doping.

Doped ions in the first doped region 1311 and/or the second doped region 1321 are formed by means of diffusion or ion implantation.

Embodiments of this disclosure further provide a memory and a method for forming the same.

A semiconductor structure is provided first. The semiconductor structure includes a substrate, a vertical transistor located on the substrate, and a bit line that is connected to the vertical transistor and located between a bottom of the vertical transistor and the substrate. In the specific manner, the semiconductor structure is as shown in FIG. 13A to FIG. 13C. The semiconductor structure may be formed by the method described in the foregoing embodiments, or by other methods. All the semiconductor structures which have a vertical transistor, and a buried bit line located at the bottom of the vertical transistor is the semiconductor structures claimed in this disclosure.

Figure 14:
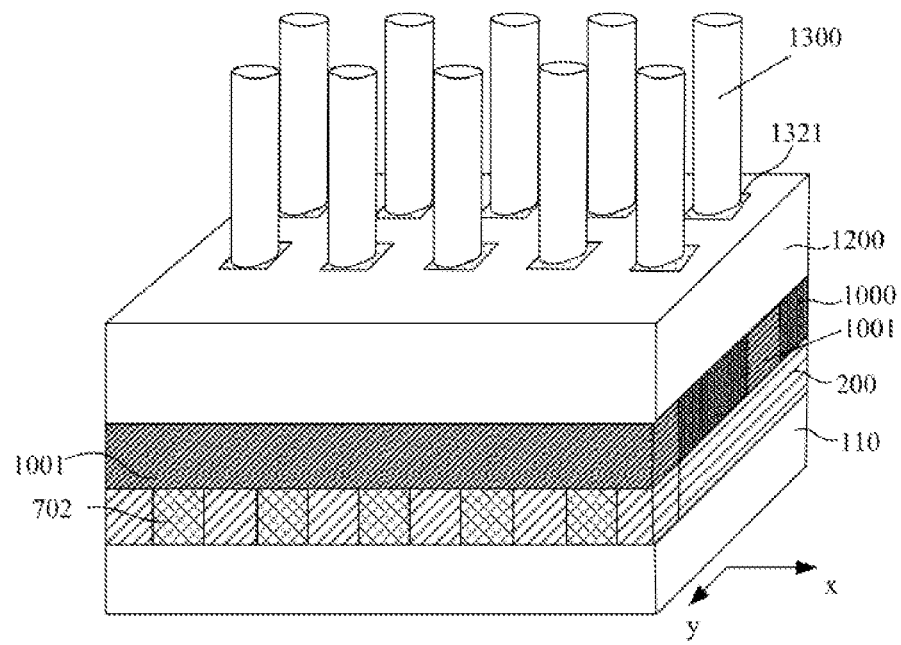
FIG. 14 is a schematic structure of a memory according to an embodiment of this disclosure.

Referring to FIG. 14, a storage unit 1300 is formed on vertical transistor, and is connected to the second doped region 1321 of vertical transistor.

In one embodiment, the memory refers to a dynamic random access memory (DRAM). The storage unit 1300 is a capacitor including a top electrode, a bottom electrode, and a capacitor dielectric layer between the top electrode and the lower electrode. The capacitor may be of a structure such as a planar capacitor, a cylindrical capacitor or the like. Those skilled in the art may select a capacitor with a suitable structure as the storage unit depending on requirements. In FIG. 14, the storage unit 1300 is only an embodiment, which does not represent the actual structure of a capacitor. In the embodiment, the second doped region 1321 of transistor is connected to one storage unit to form a 1T1C storage structure. The storage unit may include one capacitor, or two or more capacitors connected in parallel.

In other embodiments, in order to reduce a connection resistance between the second doped region 1321 and the storage unit 1300, a metal contact layer may be further formed on the second doped region 1321, and the storage unit is formed on the metal contact layer.

The storage unit 1300 is formed in a dielectric layer (not shown in the figures), an interconnected structure for connecting the bit line connecting line 702 and the gate structure 1000 may also be formed in the dielectric layer, for connecting the bit line and word line to an external circuit.

In other embodiments of this disclosure, the storage unit may further include a capacitive storage unit, a magnetic storage unit, a ferroelectric storage unit, a phase change storage unit, or a resistive storage unit.

Figure 15:
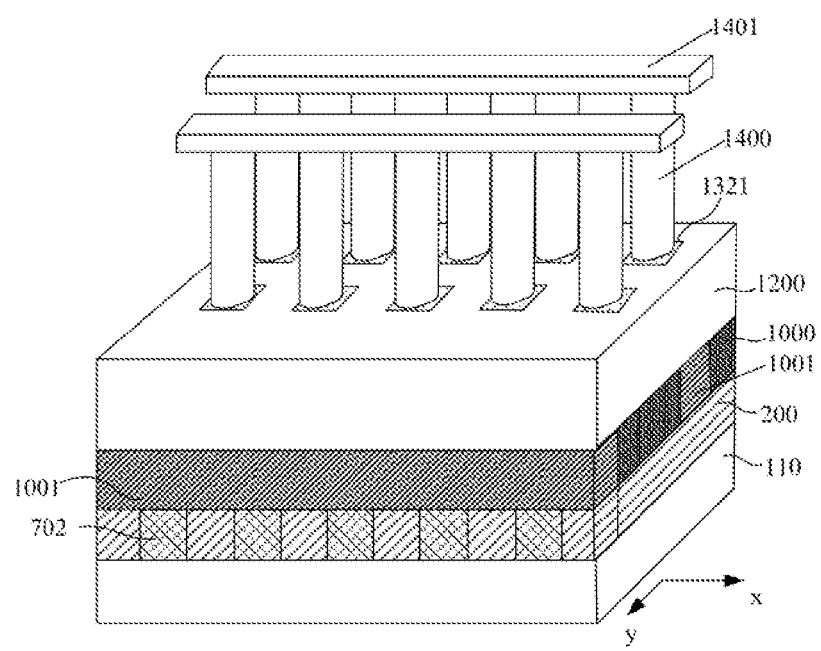
FIG. 15 is a schematic structure of a memory according to an embodiment of this disclosure.

FIG. 15 is a schematic structural diagram of a memory according to an embodiment of this disclosure.

The memory is a ferroelectric random access memory (FeRAM). A ferroelectric storage unit 1400 is formed on the second doped region 1321 of vertical transistor of the semiconductor structure shown in FIG. 13A.

The ferroelectric storage unit includes a bottom electrode connected to the second doped region 1321, a top electrode above the bottom electrode, and a ferroelectric capacitor constituted by a ferroelectric material layer located between the top electrode and the bottom electrode. The ferroelectric material layer may be made of a material of PZT (lead zirconate-titanate) or SBT (barium-strontium titanate). The ferroelectric storage unit 1400 in FIG. 15 is only for illustration, which does not represent actual structure of the ferroelectric storage unit. Those skilled in the art are able to form the ferroelectric storage unit 1400 with a corresponding structure according to needs, which is not limited herein.

For the ferroelectric storage unit 1400, a plate line 1401 connected to the top electrode is required to be formed on the ferroelectric storage unit 1400. In the embodiment, the ferroelectric storage units which are arranged on a same line along the second direction (x-direction) are connected to one same plate line 1401. With the plate line 1401 and the vertical transistor below, a two-way voltage can be applied to the ferroelectric storage unit 1400 can be achieved, so that data storage is carried out by utilizing the properties of the ferroelectric material layer.

In other embodiments, a magnetic storage unit may also be formed on the second doped region 1321 of the vertical transistor. The magnetic storage unit includes a magnetic tunneling junction. The magnetic tunneling junction includes a fixed layer, a free layer, and a dielectric layer located between the fixed layer and the free layer. The fixed layer is connected to the second doped region 1321.

In other embodiments, a storage unit with other structures or types, for embodiment, a capacitive storage unit, a magnetic storage unit, a ferroelectric storage unit, a phase change storage unit, or a resistive storage unit, may also be formed so as to form a corresponding memory.

According to the above memory and the method for forming the same, the storage density of the memory can be increased by adopting the vertical transistor serving as a control transistor connected to the storage unit, and the buried bit line connected to the control transistor.

The above are merely the preferred implementation manners of this disclosure. It should be pointed out that those of ordinary skill in the art may also make several improvements and modifications without departing from the principle of this disclosure. These improvements and modifications shall fall within the scope of protection of this disclosure.

The invention claimed is:

1. A method for forming a semiconductor structure, comprising:
providing a substrate, wherein a sacrificial layer and an active layer on the sacrificial layer are formed on the substrate;
patterning the active layer and the sacrificial layer to form grooves which divide the active layer and the sacrificial layer into a plurality of active areas;
filling the grooves to form a first isolation layer surrounding the active areas;
patterning the active layer in the active areas to form a plurality of active lines which are arranged in parallel and extend along a first direction, wherein at least one of a side wall or an end portion of each active line is connected to the first isolation layer;
removing the sacrificial layer via openings between adjacent active lines to form gaps between bottoms of the active lines and the substrate;
forming bit lines in the gaps;
patterning the active lines to form a plurality of active pillars which are arranged in array along the first direction and a second direction after the bit lines are formed;
forming semiconductor pillars on tops of the active pillars;
forming a first doped region in each active pillar;
forming, in each semiconductor pillar, a channel region and a second doped region above the channel region; and
forming a gate structure surrounding the channel region.

2. The method for forming a semiconductor structure according to claim 1, further comprising forming an isolation dielectric layer that fills between adjacent active lines after the bit lines are formed.

3. The method for forming a semiconductor structure according to claim 2, wherein a process for forming the semiconductor pillars comprises: forming a protective layer on surfaces of the first isolation layer and the isolation dielectric layer; forming epitaxial through holes in the protective layer, bottoms of the epitaxial through holes exposing a top surface of active pillar; performing an epitaxial growth of a semiconductor material on the top surface of active pillar to form the semiconductor pillars respectively located in the epitaxial through holes; and removing the protective layer.

4. The method for forming a semiconductor structure according to claim 1, wherein the forming semiconductor pillars on tops of the active pillars comprises: forming a semiconductor material on the top surfaces of the active pillars, and etching and shaping the semiconductor material to form the semiconductor pillars on the tops of the active pillars.

5. The method for forming a semiconductor structure according to claim 1, wherein a process for forming the first doped region comprises: performing ion implantation on the active line or the active pillar; and a process for forming the second doped region comprises: performing ion implantation on a top area of the semiconductor pillar to form the second doped region located at the top of the semiconductor pillar.

6. The method for forming a semiconductor structure according to claim 1, wherein a process for forming the first doped region comprises: after the active line or the active pillar is formed, forming a transitional layer with a doping element on the surface of the substrate that is located between adjacent active lines or adjacent active pillars; and diffusing at least a part of the doping element in the transitional layer into the active line or the active pillar by a diffusion treatment, so as to form the first doped region.

7. The method for forming a semiconductor structure according to claim 1, wherein a process for forming the first doped region comprises: doping the active layer by an in-situ doping process during forming the active layer with an epitaxial growth process, so that the first doped region is formed in each active pillar after the active pillars are formed; a process for forming the channel region and the second doped region comprises: performing in-situ doping to sequentially form the channel region and the second doped region by in-situ processes during forming the semiconductor pillars with the epitaxial growth process.

8. The method for forming a semiconductor structure according to claim 1, wherein a process for forming the bit lines further comprises: forming a conductive material layer that fills up the gaps and the openings; patterning the conductive material layer to only remain a portion of the conductive material layer, that is located below the active lines and extends along the first direction as the bit lines.

9. The method for forming a semiconductor structure according to claim 8, further comprising: etching the first isolation layer or the active lines to form through holes;

filling the through holes with a conductive material to form bit line connecting lines, wherein bottoms of the bit line connecting lines are connected to the bit lines.

10. The method for forming a semiconductor structure according to claim 9, wherein the through holes are located at edges of the active areas.

11. The method for forming a semiconductor structure according to claim 1, wherein a process for forming the gate structure comprises: sequentially forming a gate dielectric layer and a gate layer on surfaces of the first isolation layer, the isolation dielectric layer and the semiconductor pillars; and patterning the gate dielectric layer and the gate layer to form the gate structure surrounding the channel region in the semiconductor pillar and expose a top area of the semiconductor pillar.

12. The method for forming a semiconductor structure according to claim 11, wherein the gate structures on the surfaces of the semiconductor pillars which are in a same line along the second direction are interconnected.

13. The method for forming a semiconductor structure according to claim 1, further comprising: forming a second isolation layer covering the gate structure and the second doped region, wherein the second isolation layer exposes a top surface of the second doped region.

14. A semiconductor structure, formed with the method according to claim 1.

15. A memory, comprising:
the semiconductor structure formed with the method according to claim 1; and
storage units located above the semiconductor structure, wherein the storage units are connected to the semiconductor pillars.

16. The memory according to claim 15, wherein the storage units comprise capacitor storage units, magnetic storage units, ferroelectric storage units, phase change storage units, or resistive storage units.

17. A method for forming a memory, comprising:
providing the semiconductor structure formed with the method according to claim 1; and
forming storage units on the semiconductor structure, wherein the storage units are connected to the semiconductor pillars.

18. The method for forming a memory according to claim 17, wherein the storage units comprise capacitor storage units, magnetic storage units, ferroelectric storage units, phase change storage units, or resistive storage units.

* * * * *